United States Patent
Fukuda et al.

(10) Patent No.: US 7,560,932 B2
(45) Date of Patent: Jul. 14, 2009

(54) NUCLEAR MAGNETIC RESONANCE (NMR) PROBE

(75) Inventors: Yuzo Fukuda, Hitachi (JP); Shuya Hagiwara, Mito (JP); Kenji Kawasaki, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 51 days.

(21) Appl. No.: 11/943,731

(22) Filed: Nov. 21, 2007

(65) Prior Publication Data

US 2008/0258730 A1 Oct. 23, 2008

(30) Foreign Application Priority Data

Nov. 24, 2006 (JP) ............................. 2006-316904

(51) Int. Cl.
*G01V 3/00* (2006.01)
(52) U.S. Cl. ........................................ 324/322; 324/300
(58) Field of Classification Search ......... 324/300–322; 600/407–455; 378/5
See application file for complete search history.

(56) References Cited

U.S. PATENT DOCUMENTS 3,446,921 A * 5/1969 Denend .......................... 379/9
5,511,553 A * 4/1996 Segalowitz ................... 600/508
2007/0133736 A1* 6/2007 Chen et al. ....................... 378/5

FOREIGN PATENT DOCUMENTS

JP 2002-207072 7/2002

OTHER PUBLICATIONS

Kiyoshi et al, "Present Status of 920 MHz High-Resolution NMR Spectrometers," IEEE Trans. Appl. Supercond. vol. 14, pp. 1608-1612 (2004).

* cited by examiner

*Primary Examiner*—Brij B Shrivastav
(74) *Attorney, Agent, or Firm*—Antonelli, Terry, Stout & Kraus, LLP.

(57) ABSTRACT

There is provided a nuclear magnetic resonance probe in which the loss caused by a high frequency cable between a probe coil and a preamplifier is reduced and the sensitivity of an NMR signal is improved. A changeover switch for NMR probe is divided into a switch part including switch elements and a filter part for filtering a switch control signal and an RF transmission signal. The switch part is disposed in a probe body inserted in a magnet of the probe. The filter part is disposed near a measurement apparatus located outside the probe. As for the switch part, a section structure of thickness and width is reduced in conformity with a narrow and slender shape of the probe body. The length of a high frequency cable between the probe coil and the preamplifier is shortened remarkably, and consequently the loss can be reduced.

8 Claims, 10 Drawing Sheets

NUCLEAR MAGNETIC RESONANCE (NMR) PROBE

BACKGROUND OF THE INVENTION

The present invention relates to a probe of a nuclear magnetic resonance apparatus, and in particular to a structure of a changeover switch.

In the nuclear magnetic resonance (NMR) apparatus, detected signals are feeble. In application such as the structure analysis of protein, it is demanded to have a higher sensitivity. The NMR apparatus has a higher resolution and a higher sensitivity as the static magnetic field strength becomes strong. A superconducting magnet for generating the static magnetic field tends to become large in size ("Present Status of 920 MHz High-Resolution NMR Spectrometers," Kiyoshi et al, IEEE Trans. Appl. Supercond. Vol. 14, pp. 1608-1612 (2004)). As a result, a probe for disposing a detection coil called probe coil in a magnetic field center of the static magnetic field is also being made longer.

Since an NMR signal detected by the probe coil is very feeble, the NMR signal is typically amplified by a low noise pre-amplifier. The probe coil is connected to a low-noise pre-amplifier at a first stage by a transmission cable for high frequencies. The loss in this portion exerts a great influence on the sensitivity. The loss in the transmission cable becomes greater as the frequency becomes higher. In a high resolution NMR apparatus, therefore, the probe length becomes longer and the signal frequency becomes higher. As a result, the loss in the transmission cable tends to increase.

The simplest method to decrease the loss in a typical high frequency detection circuit is to shorten the transmission cable extended to the preamplifier at the first stage. However, this method is not easy in the case of the NMR probe. Since the probe coil conducts irradiation of a sample with an RF electromagnetic wave and detection of the NMR signal, a transmission/reception changeover switch is inserted in a stage preceding the preamplifier (JP-A-2002-207072).

SUMMARY OF THE INVENTION

In an NMR probe having a transmission/reception changeover switch, power of approximately +50 dBm is handled at the time of transmission whereas signal power of at most approximately −40 dBm is handled at the time of reception. In order to protect the preamplifier from saturation, the input of the preamplifier needs to be kept at −30 dBm or less. As for performance required of the changeover switch, it becomes necessary that the changeover switch withstands the power of +50 dBm and the changeover switch has isolation of approximately 80 dB in order to protect the preamplifier from leak power at the time of transmission. In addition, the changeover speed from the transmission state to the reception state is also important, and a changeover speed of approximately 10 us is needed. Furthermore, a contrivance to reduce the insertion loss is needed to improve the sensitivity.

If it is attempted to shorten the cable to reduce the loss in the transmission cable, therefore, it becomes necessary to reduce the size of the transmission/reception changeover switch and dispose it near the probe coil. If it is attempted to dispose the changeover switch and the preamplifier nearer the probe coil, then the changeover switch and the preamplifier are disposed in a long and slender part (hereafter referred to as probe body) inserted in a magnet of the probe, and consequently it is necessary to make the shape and dimension of the switch conform to the probe body.

In view of the problems of the conventional technique, an object of the present invention is to provide a nuclear magnetic resonance probe capable of shortening the cable between the probe coil and the preamplifier to reduce the loss and improving the sensitivity.

The present invention provides a nuclear magnetic resonance probe that has a changeover switch for changing over transmission to reception and vice versa, that transmits an electromagnetic wave (RF signal) for exciting a nuclear magnetic resonance signal to irradiate a sample with the electromagnetic wave (RF signal), and that receives a nuclear magnetic resonance electromagnetic wave signal (NMR signal) excited in the sample by the electromagnetic wave (RF signal), wherein the changeover switch is divided into a switch part including a switch element and a filter part for filtering a switch control signal and an RF transmission signal, and arranged, and only the switch part is disposed in a probe body inserted in an NMR magnet.

In order to dispose the changeover switch in the probe body, the changeover switch takes a narrow and slender shape. Furthermore, the filter part is disposed outside the probe body, or preferably near a measurement apparatus.

According to the present invention, the length of the high-frequency cable between the probe coil and the preamplifier can be shortened remarkably and consequently the loss caused in the high-frequency cable in this part can be reduced remarkably as compared with the conventional technique. As a result, a nuclear magnetic resonance probe having a high sensitivity can be provided.

Other objects, features and advantages of the invention will become apparent from the following description of the embodiments of the invention taken in conjunction with the accompanying drawings.

DESCRIPTION OF THE EMBODIMENTS

Figure 1:
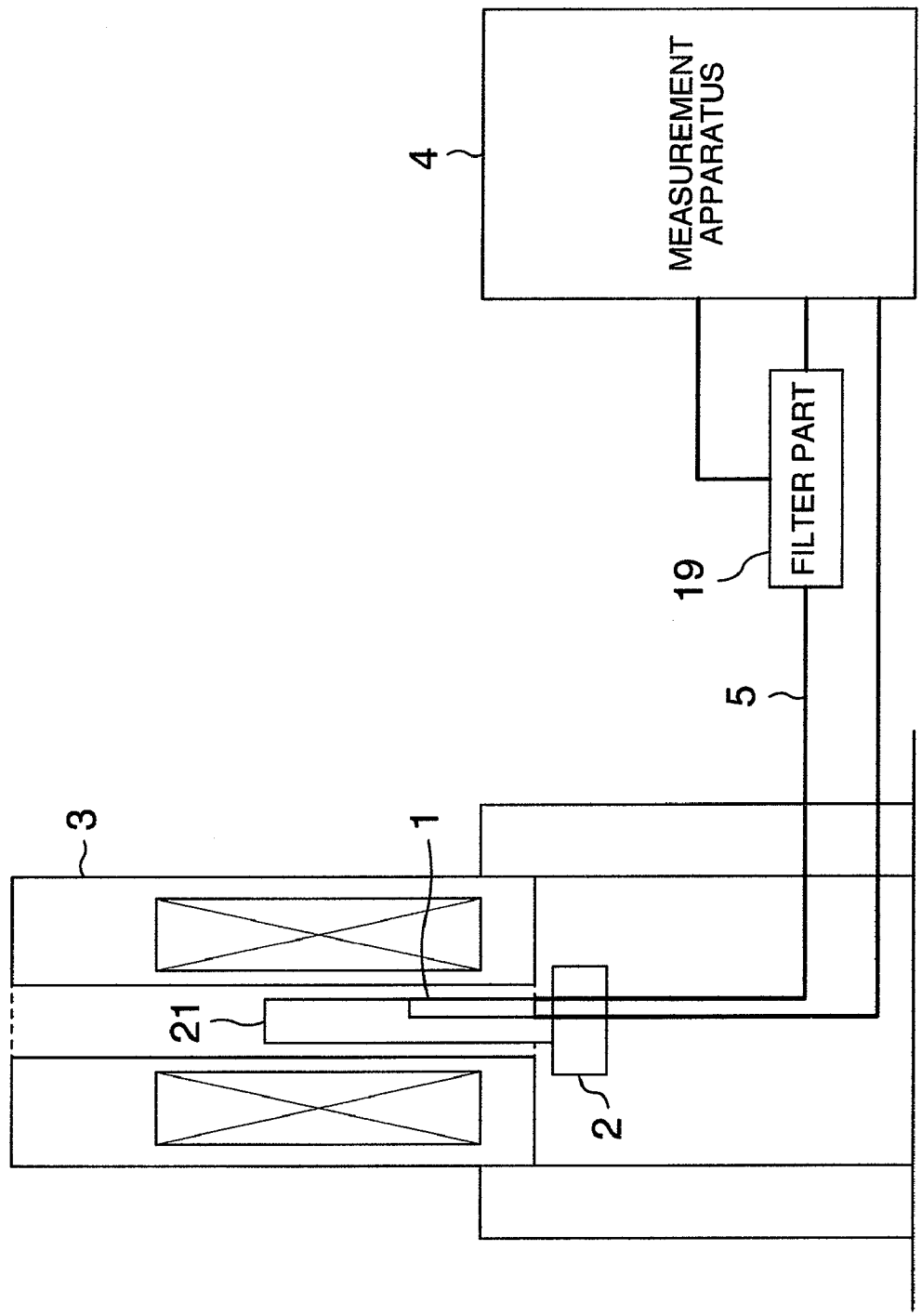
FIG. 1 is a schematic diagram of an NMR apparatus including a probe according to the present invention.

Hereafter, a plurality of embodiments according to the present invention will be described in detail with reference to the drawings. The transmission/reception changeover switch for NMR probe is required to have performance such as the insertion loss, isolation, withstanding power, and changeover speed. The changeover switch is needed not only for a probe coil of a typical transmission-reception integral coil scheme, but also for a probe coil of transmission-reception separation coil scheme provided that a preamplifier is disposed in the probe. This is because it is difficult to conduct adjustment beyond the preamplifier and it is much easier to use a changeover switch at the time of matching adjustment on the probe coil.

For disposing the changeover switch in the long and slender part of the probe as described in "SUMMARY OF THE INVENTION," the changeover switch must take a long and slender shape. In other words, it is necessary to conduct size reduction which decreases a cross section formed by the thickness and width instead of a mounting area formed by the width and length as in the conventional technique. As for the thickness direction, it is not difficult to cause the size of the changeover switch to become 10 mm or less although the thickness is limited by a printed circuit board or sizes of elements.

A nuclear magnetic resonance probe according to an embodiment of the present invention includes a changeover switch 1 for changing over between transmission and reception. Owing to the changeover switch 1, the nuclear magnetic resonance probe transmits an electromagnetic wave (RF transmission signal) for exciting a nuclear magnetic resonance signal to irradiate a sample 6 with the electromagnetic wave, and receives an electromagnetic wave signal (NMR signal) of nuclear magnetic resonance excited in the sample by the electromagnetic wave. The changeover switch 1 is disposed so as to be divided into a switch part 20 including switch elements 14 and a filter part 19 for filtering a switch control signal and the RF transmission signal. The switch part 20 is disposed in a probe body 21 inserted into an NMR magnet 3. Since the changeover switch 1 is disposed in the probe body 21, the changeover switch 1 takes a long and slender shape.

First Embodiment

FIG. 1 is a schematic diagram of an NMR apparatus according to a first embodiment of the present invention. The changeover switch 1 is disposed in the probe body 21 which is a long and slender part of the probe, and is connected to an external measurement apparatus 4 via a transmission cable 5 in order to conduct signal processing. The changeover switch is accommodated in a region of an NMR magnet 3 in a cryostat by disposing the probe 2 in the magnet.

Figure 2:
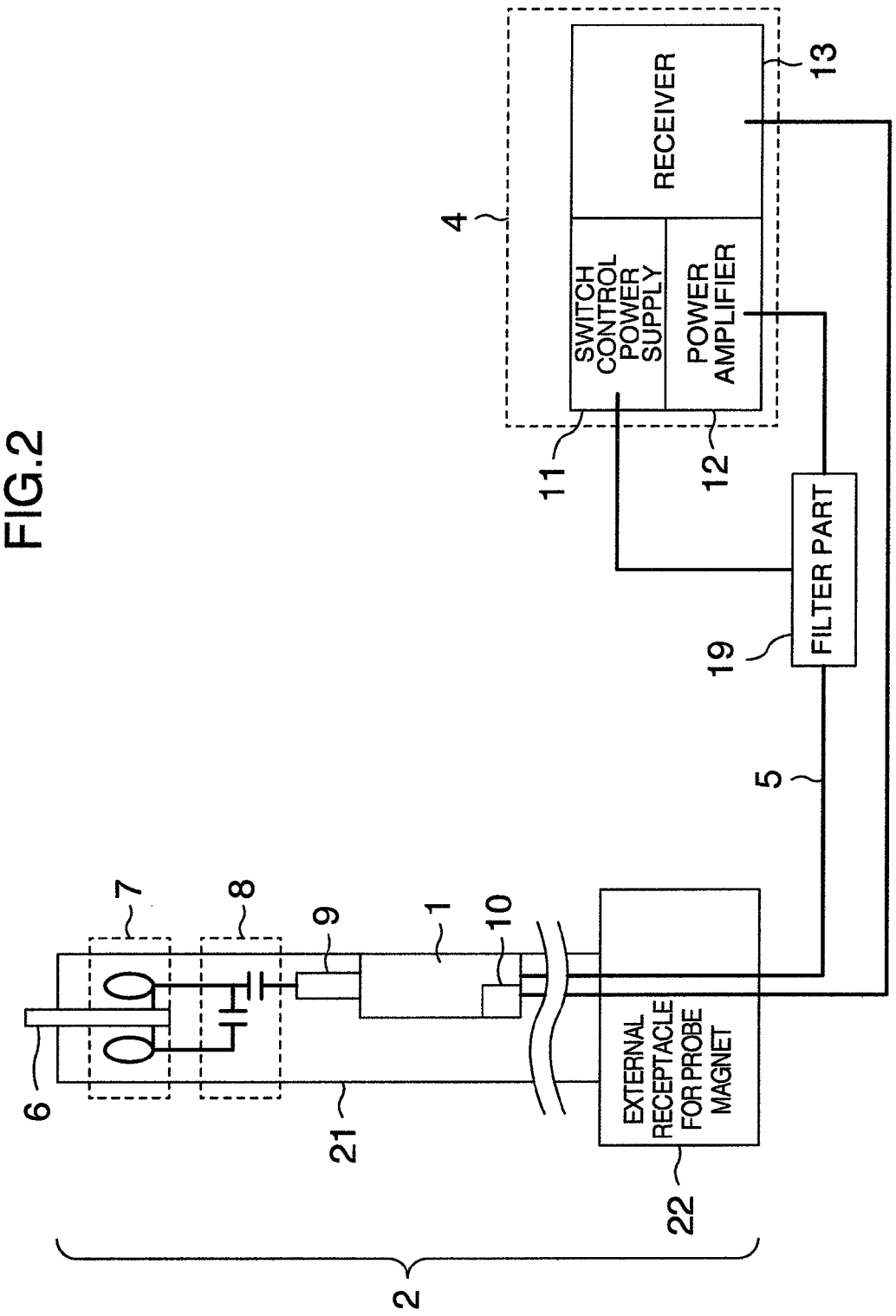
FIG. 2 is an arrangement diagram of a probe including a changeover switch according to a first embodiment of the present invention.
Figure 9A:
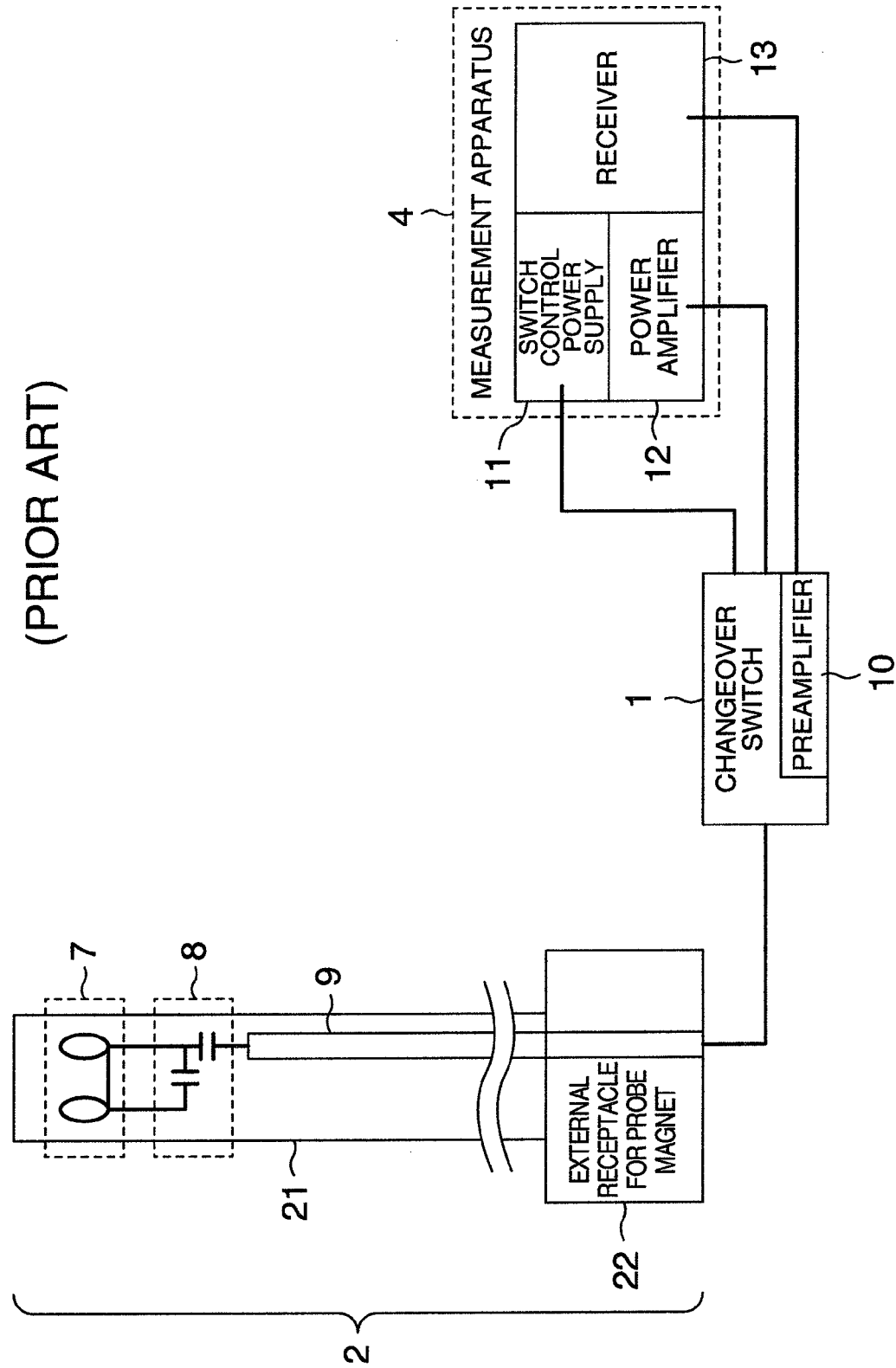
FIG. 9A is an arrangement diagram of a conventional probe.
Figure 9B:
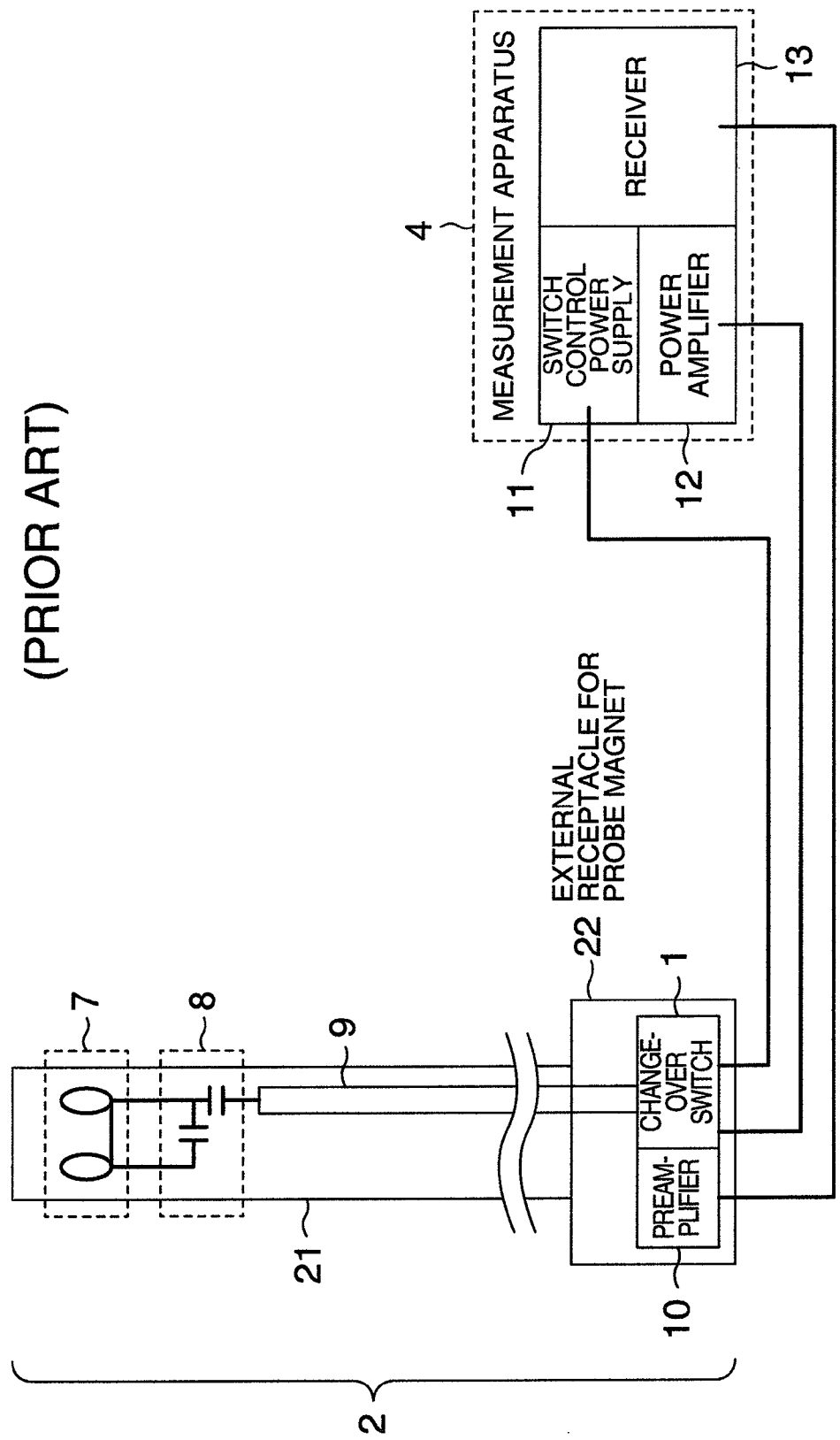
FIG. 9B is an arrangement diagram of another conventional probe.

FIG. 2 is a configuration diagram showing details of the NMR probe and the measurement apparatus in the first embodiment. The details will now be described while comparing FIG. 2 with FIGS. 9A and 9B which are configuration diagrams of conventional NMR probes. In FIGS. 2, 9A and 9B, a probe coil 7 and a tuning circuit 8 are connected to the changeover switch 1 by a transmission line 9. Selection of connection to a power amplifier 12 and a preamplifier 10 is conducted by a control signal generated by a switch control power supply 11. The sample 6 to be subject to measurement is disposed within the probe coil 7.

An NMR signal is excited in the sample 6 by a signal supplied from the power amplifier 12. The NMR signal supplied from the sample 6 is amplified by the preamplifier 10. The changeover switch 1 is used to conduct changeover between these two operations. The preamplifier 10 is connected to a receiver 13 in the measurement apparatus 4. The receiver 13 includes a frequency converter, an analog-digital converter, and a digital signal processor.

In the conventional technique, the changeover switch 1 is disposed outside the probe as shown in FIGS. 9A and 9B. FIG. 9A shows an ordinary configuration. FIG. 9B shows a configuration seen in a low temperature probe. In the configuration shown in FIG. 9B, the changeover switch 1 is disposed in a probe receptacle 22, but outside a magnet insertion part (JP-A-10-307175). On the other hand, the changeover switch 1 in the present invention is disposed in the probe body 21.

In the present invention, however, the changeover switch is divided into the switch part 20 and the filter part 19, and the switch part 20 is disposed in the probe body 21 whereas the filter part 19 is disposed near the measurement apparatus 4 and connected to the measurement apparatus 4 via the cable 5. The switching power amplifier 12 and the switch control power supply 11 are connected to the filter part 19.

The probe coil 7 is intended for detection of a plurality of nuclides in many cases. As the present embodiment, however, a system for detecting one nuclide that needs the highest sensitivity will now be described. If high sensitivities are needed in a plurality of nuclides, the configuration according to the present invention may be applied to systems of a plurality of nuclides to constitute a probe as long as the space permits.

For disposing the changeover switch 1 in the probe body 21 as shown in FIG. 2, it is necessary to constitute the changeover switch with a smaller size by using a method different from that in the conventional technique. In the method, the cross section area formed by the width and the thickness is minimized instead of minimizing the mounting area formed by the width and the length as in the conventional technique. Hereafter, details of a configuration of the changeover switch 1 will be described.

The diameter of the probe body 21 is limited by a shim coil (not illustrated) for adjusting the uniform magnetic field in the sample space by conducting current control. In many cases, the diameter of the probe body 21 is approximately 40 mm. Since a high frequency transmission cable and a shaft for adjusting a variable capacitor which is a component of the tuning circuit 8 are disposed within the probe body 21, the substantial vacancy space is limited. For disposing the changeover switch in such a small space, a contrivance described hereafter has been made with respect to the size reduction of the changeover switch.

Figure 3:
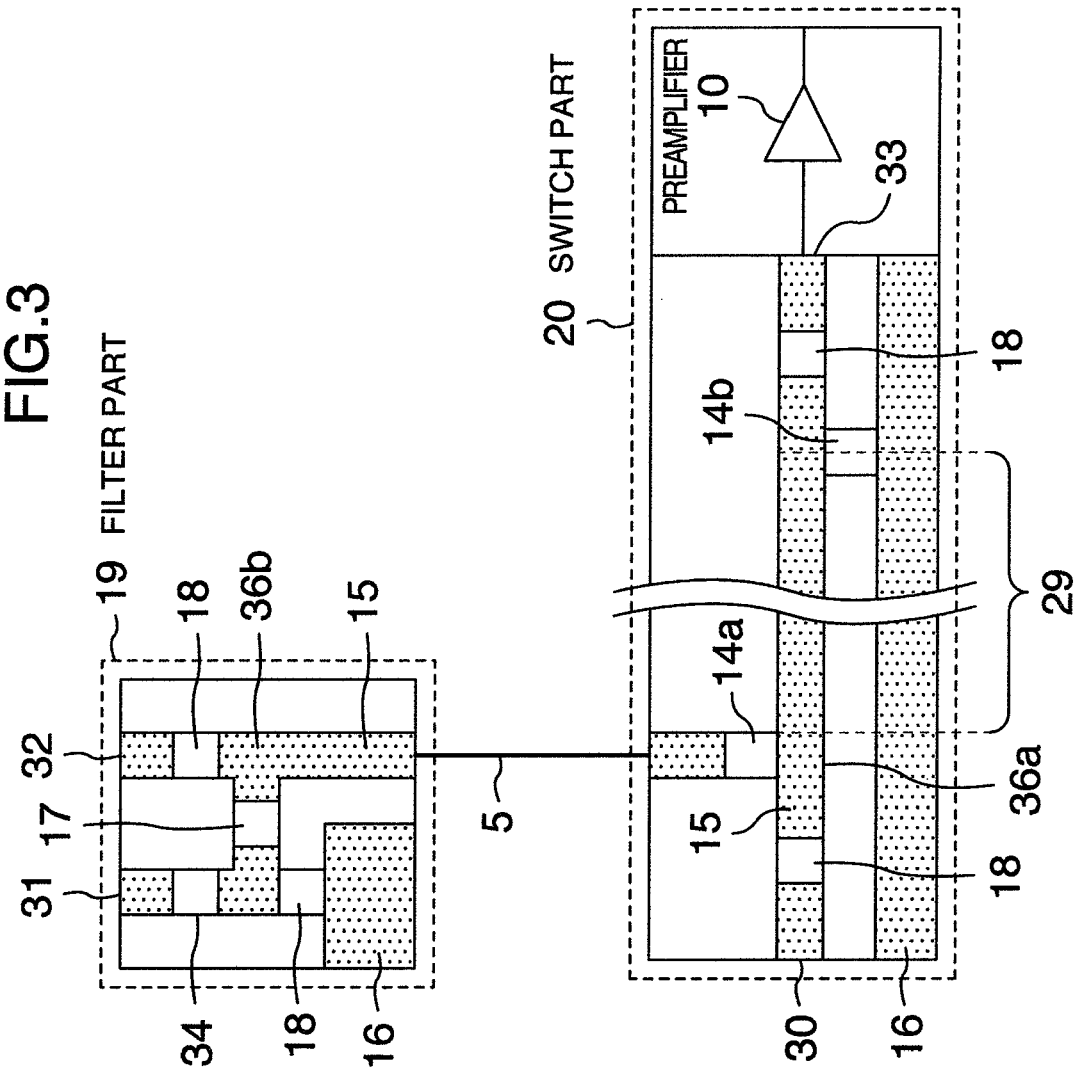
FIG. 3 is a configuration diagram of a switch part and a filter part of a changeover switch.
Figure 8:
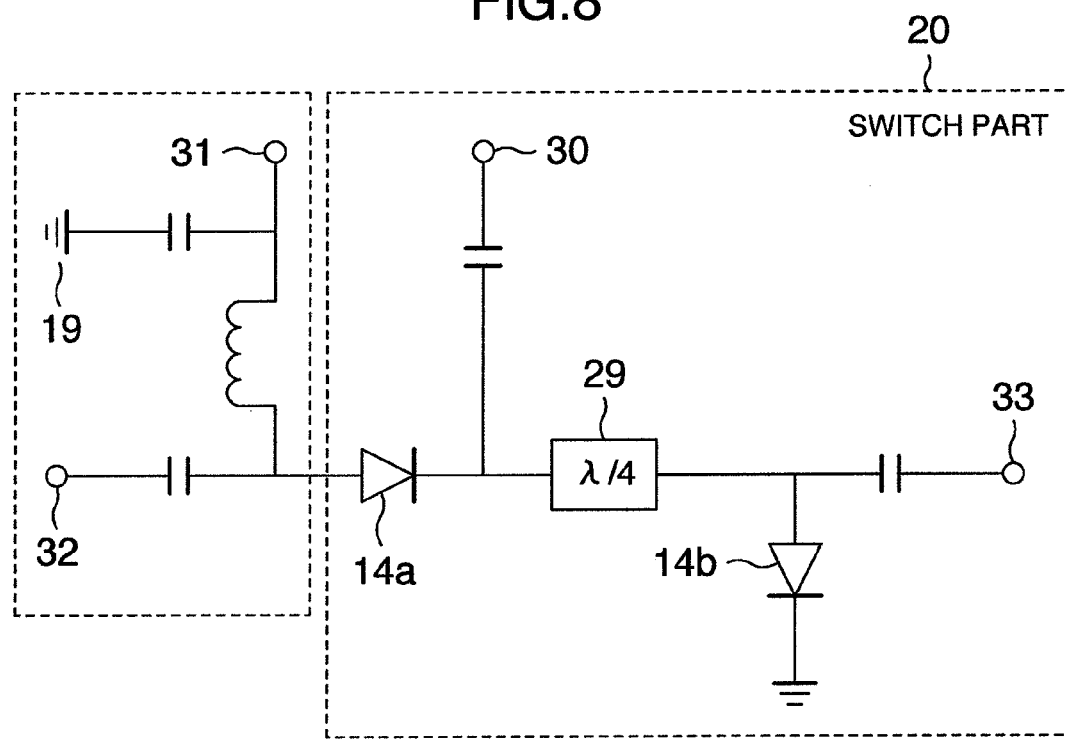
FIG. 8 is an equivalent circuit diagram of a changeover switch in a first example.

FIG. 3 shows a configuration of the changeover switch for NMR probe in the present embodiment. FIG. 8 is a simplified equivalent circuit of the changeover switch. The same reference characters in FIGS. 3 and 8 denote like components. The changeover switch 1 is divided into the filter part 19 for DC and an RF signal and the switch part 20 including the switch elements 14. The changeover switch 1 also includes the transmission cable 5 for connecting the filter part 19 and the switch part 20 to each other.

A connection port 30 for the probe coil 7 and a connection port 33 for the preamplifier 10 are disposed in the switch part 20. A connection port 31 for a switch control signal and a connection port 32 for the power amplifier 12 are disposed in the filter part 19. Ports for connecting the filter part 19 and the switch part 20 are disposed in them.

The changeover switch 1 is constituted by forming microstrip lines on double-sided printed circuit boards and disposing elements such as capacitors and diodes on the double-sided printed circuit boards. Copper foils on the surface of each of the printed circuit boards are cut off suitably to form a transmission line 15 and a ground 16. The ground is formed on the whole back of each of the printed circuit boards. The filter part 19 and the switch part 20 are housed independently in cases formed of metal such as aluminum as occasion demands. As for the connection of the transmission cable to the switch part, direct soldering without providing a connector is desirable because the space can be saved. A DC power supply (not illustrated) for driving the preamplifier 10 disposed on the same printed circuit board as that of the switch part 20 is connected from the outside to the preamplifier 10. A signal amplified by the preamplifier 10 is coupled to the external receiver 13.

The microstrip lines in the switch part 20 become the confluence of three lines that couple the probe coil 7, the preamplifier 10 and the power amplifier 12. At a branch point 36a, a line connecting the probe coil 7 and the preamplifier 10 is disposed in a rectilinear form. The line is connected to a line connected to the power amplifier 12 via a switch element 14a. As for transmission on a split line, the loss is less in the case of a rectilinear line. In the present embodiment, therefore, rectilinear connection is conducted with priority given to a route of a received signal.

The switch element 14b connects the line 15 to the ground 16 in a position located at a distance of a length 29 which is equal to one fourth of a wavelength (hereafter referred to as $\lambda/4$) at a signal frequency from the branch point in a direction of the preamplifier 10. The wavelength is an effective wavelength on the line. PIN diodes are used as the switch elements 14a and 14b. PIN diodes using gallium arsenide (GaAs) semiconductors are desirable from the viewpoint of switching characteristics and the insertion loss to the RF signal. In addition, a capacitor 18 is inserted in series near each of the connection port 30 for the probe coil 7 and the connection port 33 for the preamplifier 10. Each of the capacitors 18 has a role of intercepting a DC signal and prevents a switch control signal from leaking from the switch part 20.

Operation of the switch part 20 is conducted as described hereafter. When a switch control voltage is applied in the forward direction, both the switch elements 14a and 14b turn on. Viewing from the probe coil 7 at this time, the power amplifier 12 is connected thereto because the switch element 14a is on. The preamplifier 10 is short-circuited to the ground because the switch element 14b is on, and a signal is not transmitted to the preamplifier 10. This switch setting is used at the time of transmission in the probe.

When a switch control voltage is applied in the backward direction, both the switch elements 14a and 14b turn off. Contrary to the foregoing description, the power amplifier 12 side is opened, and the probe coil 7 is connected to the preamplifier 10. This switch setting is used at the time of reception in the probe.

The insulating property and loss between ports at the time of switch operation will now be described. When the probe coil 7 is connected to the power amplifier 12, the switch element 14b is short-circuited in a position located at a distance of the length equal to $\lambda/4$ from the branch point 36a. Since an actual switch element such as a PIN diode has some impedance in the on-state, perfect insulation is not attained. A switch configuration shown in FIG. 4 is obtained by improving this point.

Figure 4:
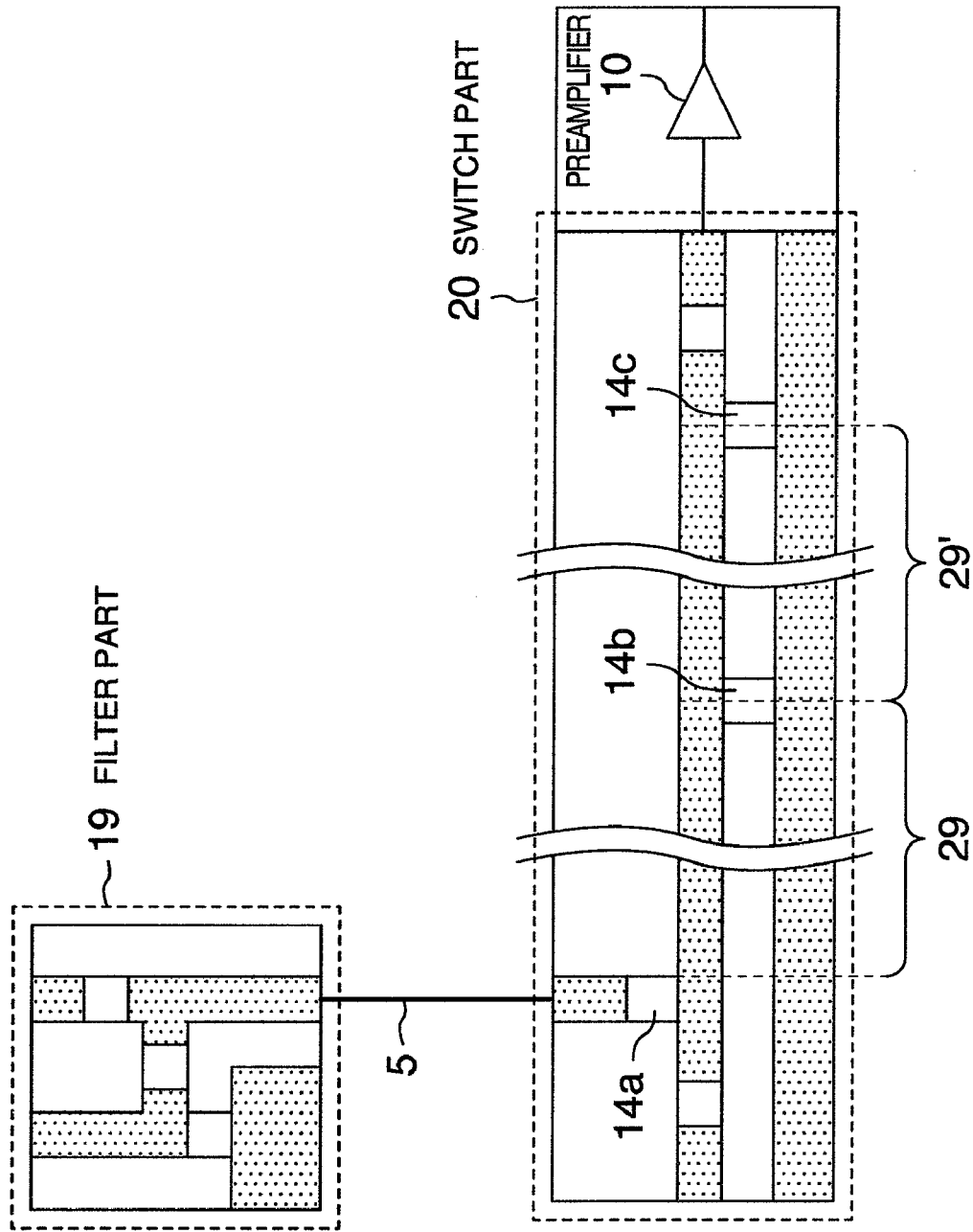
FIG. 4 is a configuration diagram showing a modification of a switch part according to a first embodiment.

FIG. 4 is a diagram showing a modification of the changeover switch shown in FIG. 3. The configuration shown in FIG. 4 is obtained from the configuration shown in FIG. 3 by providing a switch element 14c behind the switch element 14b at a distance of a length 29' equal to $\lambda/4$ and repeating the grounding once more. As a result, the insulating property in the on-state of the switch element can be enhanced.

Figure 5:
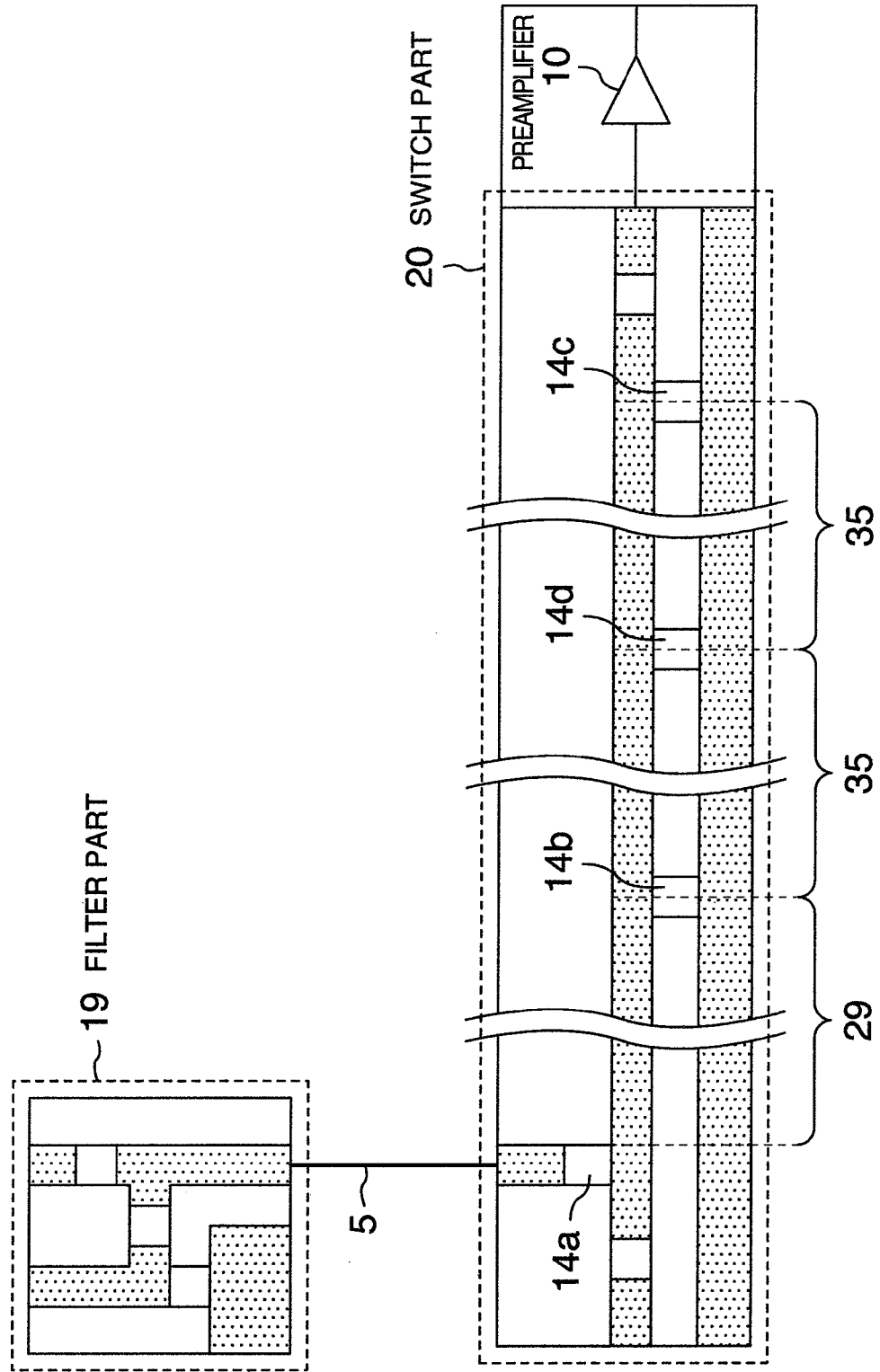
FIG. 5 is a configuration diagram showing another modification of a switch part according to a first embodiment.

FIG. 5 is a diagram showing another modification of the changeover switch. As shown in FIG. 5, a switch element 14d is added in the middle between the switch element 14b and the switch element 14c shown in FIG. 4. A distance of a line between the switch element 14b and the switch element 14d is equal to half of the distance $\lambda/4$, and becomes a length 35 which is equal to one eighth of the wavelength of the signal frequency. According to experiments, the insulating property can be further enhanced in this method as compared with the case shown in FIG. 4.

By only using the switch element 14b, the problem is not perfectly solved in ensuring a sufficient insulating property as the NMR changeover switch. However, it has become possible to ensure the sufficient insulating property by arranging a plurality of switch elements as shown in FIG. 4 or 5. In the conventional technique, it is difficult to ensure the insulating property and consequently a protection circuit using cross diodes is disposed near the input of the preamplifier in many cases and an increased loss impairs the sensitivity. On the other hand, the configuration according to the present invention brings about an effect that the protection circuit can be made unnecessary and the sensitivity of the probe can be further improved because the sufficient insulating property between the preamplifier and the power amplifier can be ensured at the time of transmission.

When the probe coil 7 is connected to the preamplifier 10 at the time of reception, the impedance of the switch elements does not become perfect infinite and consequently perfect insulation cannot be obtained in some cases. Therefore, the impedance may be made high by applying a reverse voltage to each of the switch elements and causing parallel resonance of capacitive impedance that remains in the off-state. In a typical PIN diode, the impedance obtained when the reverse voltage is applied becomes a little higher than as compared with when the voltage is made zero, resulting in an advantage in obtaining the insulating property. Parallel resonance with the PIN diode is brought about by adding capacitors and an inductor. It is desirable to conduct this for each of the PIN diodes.

The filter part 19 conducts filtering between the switch control signal and the RF signal by using capacitors 18 and an inductor 17. Capacitors are inserted in series near the connection port 32 for the power amplifier 12 to intercept a switching signal from the power amplifier 12. As each of the capacitors 18, a capacitance that insulates in the DC current and that becomes low impedance at high frequencies is selected. On the other hand, the inductor 17 is connected in series and the capacitors 18 are connected in parallel between a branch point 36b and the connection port 31 for the switch control power supply. This combination is selected so as to drop the RF signal to the ground and let the DC signal pass.

In addition, it is necessary to select a combination by which the changeover speed can be ensured sufficiently. A resistor 34 is inserted in series on the switch control signal side in order to protect the switch control power supply. If it is attempted to exercise voltage control on a PIN diode in a switch element, there is a fear that a large current suddenly will flow and the power supply will fail even when the voltage is made a little too high. In order to avoid this, the resistor element 34 having a suitable size is inserted in series to limit the amount of the flowing current. As a result, the power supply is protected.

In the filter part 19, both the RF signal and the DC are filtered sufficiently and consequently mutual flow-in of signals can be neglected. Furthermore, in the conventional integral structure, flow-in of the signal onto the preamplifier side via a line occurs unless an input line of a switch signal is installed with sufficient care. In the configuration according to the present invention, however, separation is conducted and unnecessary flow-in does not occur even if attention is not paid especially to leading about of the switching line. It is also advantageous in the insulating property between transmission and reception to thus separate the filter part 19 in the configuration. In this way, it becomes possible to handle great power while protecting the preamplifier.

In the configurations shown in FIGS. 3 to 5, the line 29 having the length of λ/4 takes a rectilinear shape. Therefore, correspondence between simulations and actual results is fine and the design can be conducted with comparative ease. Furthermore, there is an advantage that the switch elements can be adjusted to be located in positions that bring about the highest insulating property at the time of mounting.

The low-noise preamplifier 10 connected to the switch part 20 may be disposed integrally on the printed circuit board of the switch part 20. FIGS. 3 to 5 show configurations in which the preamplifier 10 is disposed on the same printed circuit board. An advantage obtained by disposing the preamplifier on the same printed circuit board is that the loss factors are decreased and the line length can be made the shortest because connectors are not used. If the switch part 20 and the preamplifier 10 are designed individually, a capacitor for cutting off the DC component needs to be inserted. However, the loss corresponding to one capacitor can be decreased by disposing the switch part 20 and the preamplifier 10 on the same printed circuit board.

The filter part 19 and the switch part 20 are connected to each other by the coaxial cable 5. The DC signal for switching and the RF signal for irradiation flow through the coaxial cable 5. In the conventional configuration, two cables, i.e., a cable for switching and a coaxial cable for the RF signal are pulled about in the probe. According to the present invention, however, only one coaxial cable is needed, and consequently the space can be advantageously saved.

Figure 10:
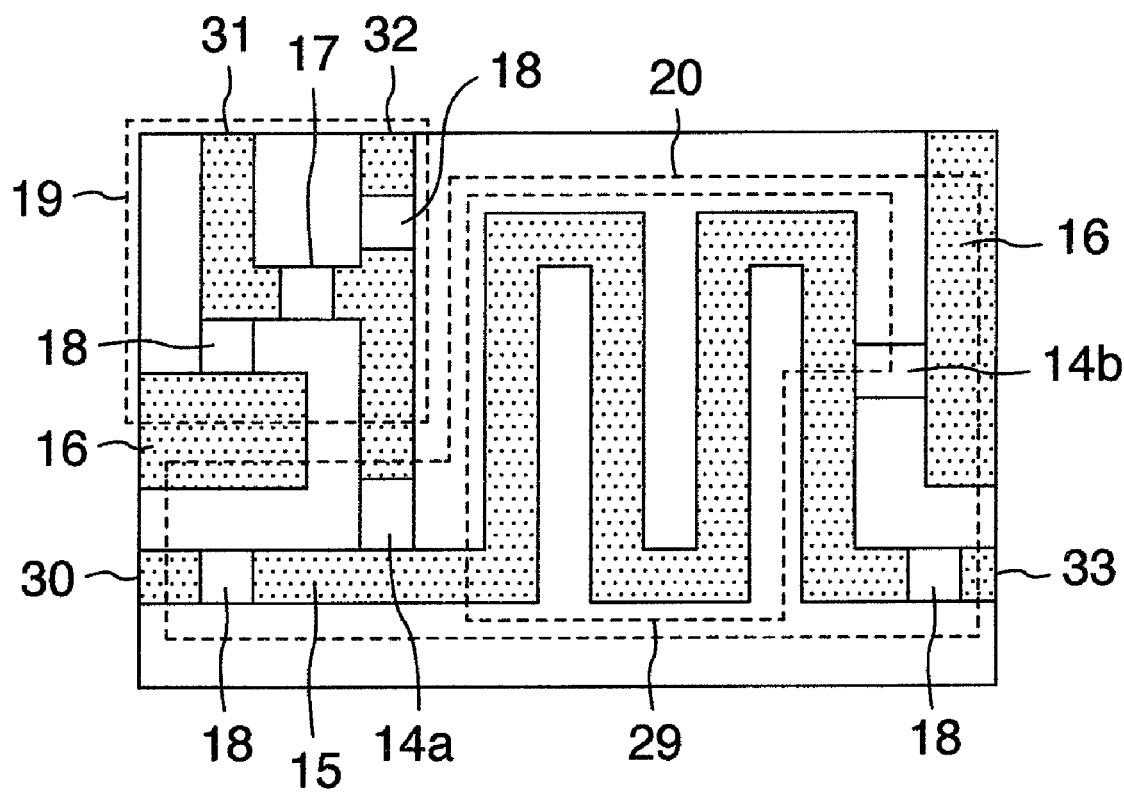
FIG. 10 is a configuration diagram of a switch part and a filter part of a conventional changeover switch.

FIG. 10 is an example of a configuration diagram of a conventional changeover switch for NMR probe. The example is an example seen in the conventional technique (see "High frequency circuit design in GHz age" (Yuichi Ichikawa et al., CQ publication). Its equivalent circuit diagram is the same as the equivalent circuit diagram (FIG. 8) of the changeover switch according to the present invention. In FIG. 10, the line 29 having the length of λ/4 is formed so as to meander. In this method, the mounting area becomes small, but dimensions of the width and length do not sufficiently small and it is difficult to dispose the line 29 on the long and slender shape such as the probe body. If the line having the length of λ/4 is simply formed rectilinearly, then connection parts to the switch control power supply and the power amplifier become bulky and the width cannot be made narrow sufficiently.

If only size reduction is considered, the changeover switch can also be implemented by using a printed circuit having a high permittivity. Since the line width becomes fine, however, it is not necessarily profitable if the balance to high power transmission and line loss is considered. Sufficient size reduction can be achieved with a printed circuit board having a relative permittivity of approximately 3. As for such printed circuit boards, there are a large number of printed circuit boards using a mixture of fluorine resin and glass, resulting in a large number of choices.

For housing in the probe body 21 so as to have no interference with other components, a sufficient size in mounting is approximately 200 mm in length, 20 mm in width and 10 mm in thickness. According to the present invention, the length becomes a little longer than that according to the conventional technique. However, there is no problem because the mounting space can allow the length. As a result of applying the present invention, the cable length between the probe coil 7 and the probe coil connection port 30 of the changeover switch 1 can be shortened from at least 1 m corresponding to the probe length to 0.3 m, and the cable loss can be suppressed to one third or less.

The present invention becomes more profitable when the signal frequency is high. Because the wavelength of the electromagnetic wave is in inverse proportion to its frequency and the wavelength becomes short as the frequency increases and the length to the preamplifier can be shortened. Furthermore, since the probe also becomes long because of the large-sized magnet, a long and slender mounting space can be ensured easily.

Second Embodiment

Figure 6:
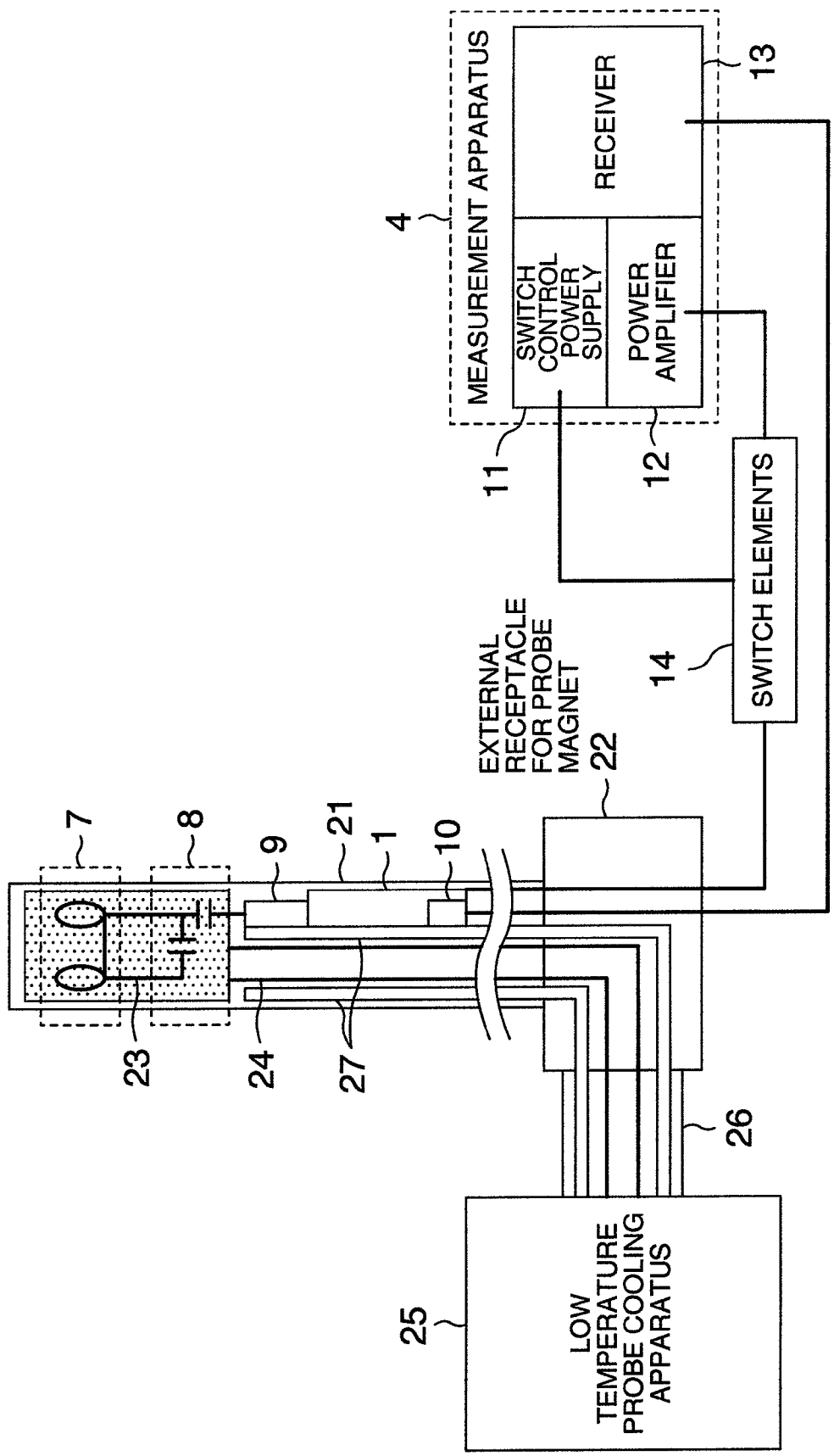
FIG. 6 is a configuration diagram of a probe including a changeover switch according to a second embodiment of the present invention.

The changeover switch 1 according to the present invention is also effective to a low temperature probe in which the probe coil 7 is cooled. FIG. 6 shows a schematic configuration of a low temperature probe and an arrangement configuration of the changeover switch according to the present invention. In the low temperature probe, the probe coil 7 and the tuning circuit 8 are cooled by a heat exchanger 23. Noise contained in the original signal is much smaller as compared with the case of the probe at the room temperature, and the influence of the loss generated by the cable 9 as far as the preamplifier 10 becomes greater. A coolant cooled by a cooling apparatus 25 flows through a coolant transport pipe 26 and a coolant pipe 24 in the probe to cool the heat exchanger 23.

A second embodiment differs from the first embodiment only in the cooling configuration, and the mounting configuration and the operation of the changeover switch 1 are the same. The cooling configuration includes a thermal radiation shield 27 which retains cooling of the changeover switch 1 together with the heat exchanger 23 and the coolant pipe 24 especially for cooling the probe coil 7. The PIN diode switch elements 14 using gallium arsenide described with reference to the first embodiment is suitable as low temperature switch elements as well because characteristics change little when cooled.

In the case of the low temperature probe, demands for size reduction of the changeover switch become higher. Because the inside of the receptacle of the low temperature probe is subject to vacuum insulation, a gap must be kept suitably between layers that are different in temperature in the internal structures, and the internal structures must be supported adiabatically. The allowed dimension of the outermost layer is the same as that in the probe at the normal temperature. According to the present invention method, however, the probe is made sufficiently small in size and consequently the probe can be installed in the case of the low temperature probe as well.

Figure 7:
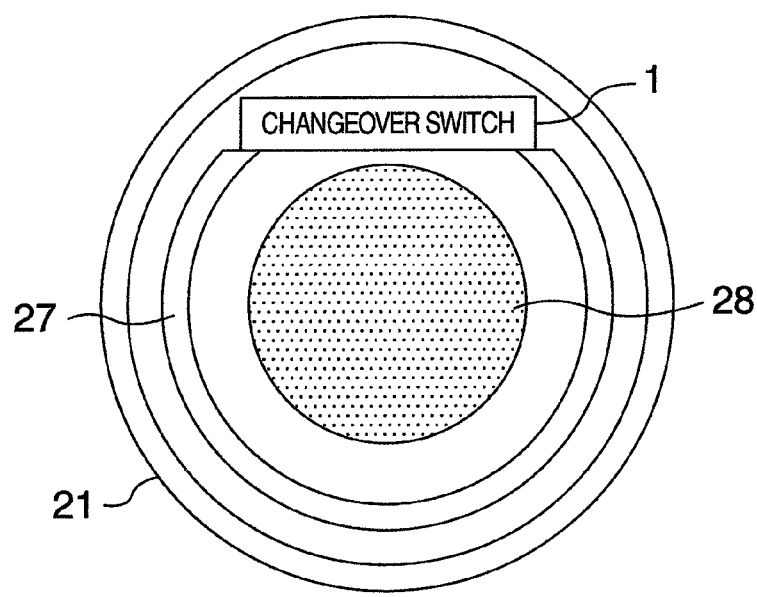
FIG. 7 is a sectional arrangement diagram showing a probe section in a second embodiment.

FIG. 7 shows an arrangement diagram of a probe section. In the probe section, the changeover switch 1 and the preamplifier 10 are arranged within the thermal radiation shield 27 and cooled. The changeover switch 1 is made small sufficiently, and a space 28 for letting the capacitor adjustment shaft and the coolant pipe pass can be ensured in the probe section. The desired cooling temperature of the changeover switch 1 is typically approximately 80K, or preferably 50K or less. As the temperature becomes lower, the cable loss is reduced and the amplifier characteristics are improved and consequently a higher sensitivity can be obtained.

Apart from FIG. 6, it is also possible to cool the changeover switch 1 directly by using a system for cooling the probe coil 7. In this case, it becomes possible to cool the changeover switch 1 to 20K or less. In this method, however, design must be conducted cautiously so as to prevent heat generated by the changeover switch and the preamplifier from raising the temperature of the probe coil 7 excessively and consequently lowering the sensitivity. At this time, the changeover switch 1 should not be fixed directly to the thermal radiation shield 27, but should be supported adiabatically or prevented from being in contact with the thermal radiation shield 27.

The line for cooling the probe coil is small in cooling capability and the specific heat of the substance is also small. As a result, conditions on cooling are strict. In the above-described method of cooling the probe coil by using the thermal radiation shield, some thermal load is incurred by heat generated by the preamplifier and so on. Since the cooling source has a high cooling capability and there is a margin in the thermal load, however, a temperature rise that increases noise extremely does not occur.

It is profitable in cooling as well to separate the filter part. A resistor for facilitating the switching control is inserted in the filter part 19. However, this becomes a considerable heat source when cooling the probe coil to an extremely low temperature. In the conventional configuration, the filter part 19 cannot help being cooled together with the switch part and it forms a thermal load for the cooling apparatus. In the present invention, the filter part is separated from the switch part and disposed at the room temperature, and consequently the filter part is no longer the thermal load of the cooling apparatus.

The narrow and slender structure of the changeover switch is more suitable to cooling than the conventional structure. The insulation layer of the printed circuit board is not excellent in thermal conductivity in many cases, and it is not suitable to cooling. Furthermore, a printed circuit board stated to have a good thermal conductivity is also considerably inferior to a material having a good thermal conductivity such as metal. Since the ground of the printed circuit board is a copper foil, the thermal conductivity is good and in addition the copper foil can come in direct contact with the cooling stage, and consequently cooling can be conducted relatively favorably. On the other hand, since not only the RF signal but also the DC current always flows, a signal line in which heat is generated looks like a floating island with respect to the ground plane and the structure is not a structure suitable for cooling. In the conventional signal line having the meandering structure, a cooling route from the periphery cannot be ensured successfully and consequently heat drain near the center becomes poor. In the scheme of the narrow and slender structure, the cooling route of the periphery can be ensured successfully and consequently the heat drain is good and the temperature can be made uniform.

Thus, according to the method of the present invention, the preamplifier can be brought close to the probe easily. As a result, the detection sensitivity can be improved remarkably as compared with the conventional technique.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A nuclear magnetic resonance probe that has a changeover switch for changing over transmission to reception and vice versa, that transmits an electromagnetic wave (RF signal) for exciting a nuclear magnetic resonance signal to irradiate a sample with the electromagnetic wave (RF signal), and that receives a nuclear magnetic resonance electromagnetic wave signal (NMR signal) excited in the sample by the electromagnetic wave (RF signal),
   wherein
   the changeover switch is divided into a switch part including a switch element and a filter part for filtering a switch control signal and an RF transmission signal, and arranged, and
   only the switch part is disposed in a probe body inserted in an NMR magnet.

2. The nuclear magnetic resonance probe according to claim 1, wherein the switch part takes, in thickness and width thereof, a narrow and slender shape adapted to a shape of the probe body.

3. The nuclear magnetic resonance probe according to claim 1, wherein
   the changeover switch comprises a preamplifier for amplifying the received electromagnetic signal, and
   the switch part and the preamplifier are disposed on same printed circuit board.

4. The nuclear magnetic resonance probe according to claim 1, wherein the filter part is disposed outside the probe body.

5. The nuclear magnetic resonance probe according to claim 1, wherein in the switch part,
   a line connecting a probe coil to a preamplifier is disposed in a rectilinear form,
   a line connected to a power amplifier is connected to an arbitrary branch point on the rectilinear line via a first switch element, and
   in a position located at a distance equivalent to one fourth of a wavelength of the electromagnetic wave signal from the branch point on the rectilinear line in a direction of the preamplifier, a second switch element is connected between the rectilinear line and ground.

6. The nuclear magnetic resonance probe according to claim 5, wherein in a position located at a distance equivalent to one fourth of a wavelength of the electromagnetic wave signal from the second switch element on the rectilinear line in a direction of the preamplifier, a third switch element is connected between the rectilinear line and ground.

7. The nuclear magnetic resonance probe according to claim 6, wherein in a middle between the second switch element and the third switch element, a fourth switch element is connected between the rectilinear line and ground.

8. The nuclear magnetic resonance probe according to claim 1, wherein the switch part is cooled to 80K or less.

* * * * *